(12) United States Patent
Kim et al.

(10) Patent No.: US 12,142,204 B2
(45) Date of Patent: Nov. 12, 2024

(54) POWER SUPPLY DEVICE AND DISPLAY APPARATUS INCLUDING THE SAME

(71) Applicant: LG Display Co., Ltd., Seoul (KR)

(72) Inventors: Tae Woo Kim, Paju-si (KR); Jae Han Kim, Seoul (KR); Sang Yeop Jeon, Seoul (KR); Sang Yeol Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 384 days.

(21) Appl. No.: 17/552,113

(22) Filed: Dec. 15, 2021

(65) Prior Publication Data

US 2022/0208938 A1 Jun. 30, 2022

(30) Foreign Application Priority Data

Dec. 30, 2020 (KR) .......... 10-2020-0187861

(51) Int. Cl.
*G09G 3/3225* (2016.01)
*H01M 10/42* (2006.01)
*H10K 59/131* (2023.01)

(52) U.S. Cl.
CPC ........ *G09G 3/3225* (2013.01); *H01M 10/425* (2013.01); *H10K 59/131* (2023.02);
(Continued)

(58) Field of Classification Search
CPC ............... H10K 59/131; G09G 3/3225; G09G 2310/08; G09G 2330/028; G09G 2360/16;
(Continued)

(56) References Cited

U.S. PATENT DOCUMENTS

| 2012/0044231 | A1 | 2/2012 | Park | |
| 2013/0235010 | A1* | 9/2013 | Park | H05B 47/25 345/212 |

(Continued)

FOREIGN PATENT DOCUMENTS

| KR | 10-2012-0018256 A | 3/2012 |
| KR | 10-2016-0053197 A | 5/2016 |

(Continued)

OTHER PUBLICATIONS

Notice of Allowance issued on Sep. 12, 2024 in corresponding Korean Patent Application No. 10-2020-0187861.

*Primary Examiner* — Premal R Patel
(74) *Attorney, Agent, or Firm* — Morgan, Lewis & Bockius LLP

(57) ABSTRACT

A disclosed display apparatus may include a display panel having a plurality of sub-pixels and configured to display an image based on an image signal provided to the display panel; a controller configured to determine a required power for at least one frame of the image signal and to output a switch signal based on determining if the required power is equal to or higher than a predetermined reference power; and a power supply device configured to receive an external AC power and to generate a first high-level voltage and a second high-level voltage. The power supply device may be further configured, based on the switch signal, to output the first high-level voltage to drive the display panel, or to combine the second high-level voltage with the first high-level voltage to generate a third high-level voltage and to output the third high-level voltage to drive the display panel.

20 Claims, 5 Drawing Sheets

(52) U.S. Cl.
CPC ... *G09G 2310/08* (2013.01); *G09G 2330/028* (2013.01); *H01M 2010/4271* (2013.01)

(58) Field of Classification Search
CPC .......... G09G 3/2074; G09G 2330/021; H01M 10/425; H01M 2010/4271
See application file for complete search history.

(56) References Cited

U.S. PATENT DOCUMENTS

| | | | |
|---|---|---|---|
| 2013/0235016 A1* | 9/2013 | Seo .................. | G09G 3/3208 |
| | | | 345/212 |
| 2016/0125799 A1 | 5/2016 | Shin | |
| 2016/0133223 A1 | 5/2016 | Kim et al. | |
| 2017/0124958 A1 | 5/2017 | Pyo et al. | |
| 2018/0053463 A1* | 2/2018 | Kong .................. | G09G 3/20 |
| 2018/0061322 A1 | 3/2018 | Yim et al. | |
| 2020/0144916 A1* | 5/2020 | Lee .................. | H02M 1/36 |
| 2021/0375214 A1* | 12/2021 | Kim .................. | G09G 5/10 |

FOREIGN PATENT DOCUMENTS

| | | |
|---|---|---|
| KR | 10-2016-0057028 A | 5/2016 |
| KR | 10-2017-0049735 A | 5/2017 |
| KR | 10-2018-0025508 A | 3/2018 |

* cited by examiner

POWER SUPPLY DEVICE AND DISPLAY APPARATUS INCLUDING THE SAME

This application claims the benefit of Korean Patent Application No. 10-2020-0187861, filed on Dec. 30, 2020, which is hereby incorporated by reference as if fully set forth herein.

BACKGROUND

1. Technical Field

The present disclosure relates to a power supply device and a display apparatus including the same.

2. Description of the Related Art

With the development of information technology, the market for display devices serving as connecting media between users and information is growing. Accordingly, display devices such as a light emitting display (LED), a quantum dot display (QDD), and a liquid crystal display (LCD) are increasingly used.

Among display devices, an organic light-emitting display has been spotlighted due to a high response speed, a wide viewing angle, high color reproducibility, and a thin structure.

Recently, an organic light-emitting display having a high definition and a large screen has been developed. The organic light-emitting display emits light according to a driving current and thus requires a power supply capable of supplying high power. However, a power supply that supplies high power can be large and expensive.

SUMMARY

Accordingly, the present disclosure is directed to a power supply device and a display apparatus including the same that substantially obviate one or more problems due to limitations and disadvantages of the related art.

An object of the present disclosure is to provide a power supply device that can be designed in a compact structure and can supply power with large current and a display apparatus including the same.

To achieve these objects and other advantages and in accordance with the purpose of the disclosure, as embodied and broadly described herein, a display apparatus may include: a display panel having a plurality of sub-pixels and configured to display an image based on an image signal provided to the display panel; a controller configured to determine a required power for at least one frame of the image signal and to output a switch signal based on determining if the required power is equal to or higher than a predetermined reference power; and a power supply device configured to receive an external AC power and to generate a first high-level voltage and a second high-level voltage. The power supply device may be further configured, based on the switch signal, to output the first high-level voltage to drive the display panel, or to combine the second high-level voltage with the first high-level voltage to generate a third high-level voltage and to output the third high-level voltage to drive the display panel.

The controller may include at least one of: a timing controller configured to supply the image signal to the display panel and to control operation timing of the display panel; and a system on chip (SOC) configured to drive the display panel.

The power supply device may be configured: to output the first high-level voltage to drive the display panel if the required power for the at least one frame of the image signal is determined to be lower than the predetermined reference power; and to combine the second high-level voltage with the first high-level voltage to generate a third high-level voltage and to output the third high-level voltage to drive the display panel if the required power for the at least one frame of the image signal is determined to be equal to or higher than the predetermined reference power.

The power supply device may comprises: a first power supply configured to receive the AC power and to generate the first high-level voltage; a battery configured to generate the second high-level voltage; and a current sharing circuit configured to output the first high-level voltage or the third high-level voltage to drive the display panel based on the switch signal.

The controller may be configured to output a turn-on switch signal as the switch signal to the current sharing circuit such that the third high-level voltage is output if the required power for the at least one frame of the image signal is equal to or higher than the predetermined reference power.

The controller may be configured to limit a luminance of the image signal displayed on the display panel if a charge level of the battery is at or below a reference level.

The display apparatus may further include a battery management circuit configured to control the AC power to be charged in the battery and to detect a state of the battery, including at least one of a lifespan of the battery, a voltage level of the battery, a charge level of the battery, a temperature of the battery, and a battery failure state.

The controller may be configured to receive the state of the battery from the battery management circuit and to provide information on the state of the battery to the display panel to be displayed on the display panel.

The current sharing circuit may include at least one of: a first current limit circuit connected to an output line of the first power supply and configured to limit a current value of the first high-level voltage to a first predetermined value or less; and a second current limit circuit connected to an output line of the battery and configured to limit a current value of the second high-level voltage to a second predetermined value or less.

The current sharing circuit may be configured to connect an output line of the first power supply and an output line of the battery in parallel to output the third high-level voltage based on the switch signal.

The current sharing circuit may include a switch configured: to connect the output line of the first power supply for the first high-level voltage with the output line of the battery for the second high-level voltage if the switch signal is a turn-on switch signal; and to disconnect the output line of the first power supply for the first high-level voltage from the output line of the battery for the second high-level voltage if the switch signal is a turn-off switch signal.

The battery may be configured to be charged if the required power for the at least one frame of the image signal is determined to be less than the predetermined reference power.

In another aspect of the present disclosure, a power supply device, for use in a display apparatus including a display panel and a controller, may include: a first power supply configured to receive an AC power and to generate a first high-level voltage; a battery configured to generate a second high-level voltage; and a current sharing circuit configured, based on a switch signal from the controller, to output the first high-level voltage to drive the display panel, or to combine the first high-level voltage with the second high-level voltage to generate a third high-level voltage and to output the third high-level voltage to drive the display panel.

The power supply device may further include a battery management circuit configured to control the AC power to be charged in the battery and to detect a state of the battery, including at least one of a lifespan of the battery, a voltage level of the battery, a charge level of the battery, a temperature of the battery, and a battery failure state.

The current sharing circuit may include at least one of: a first current limit circuit connected to an output line of the first power supply and configured to limit a current value of the first high-level voltage to a first predetermined value or less; and a second current limit circuit connected to an output line of the battery and configured to limit a current value of the second high-level voltage to a second predetermined value or less.

The current sharing circuit may be configured to connect an output line of the first power supply and an output line of the battery in parallel to output the third high-level voltage based on the switch signal.

The current sharing circuit may include a switch configured to: connect the output line of the first power supply for the first high-level voltage with the output line of the battery for the second high-level voltage if the switch signal is a turn-on switch signal; and to disconnect the output line of the first power supply for the first high-level voltage from the output line of the battery for the second high-level voltage if the switch signal is a turn-off switch signal.

In yet another aspect of the present disclosure, a method of supplying power in a display apparatus, including a display panel having a plurality of sub-pixels and configured to display an image based on an image signal, may include: receiving an AC power and generating a first high-level voltage; generating a second high-level voltage; determining a required power for at least one frame of the image signal; outputting a switch signal based on determining if the required power is equal to or higher than a predetermined reference power; and based on the switch signal, outputting the first high-level voltage to drive the display panel, or combining the second high-level voltage with the first high-level voltage to generate a third high-level voltage and outputting the third high-level voltage to drive the display panel.

The outputting of the first high-level voltage or the third high-level voltage based on the switch signal may include: outputting the first high-level voltage to drive the display panel if the required power for the at least one frame of the image signal is determined to be lower than the predetermined reference power, or combining the second high-level voltage with the first high-level voltage to generate a third high-level voltage and outputting the third high-level voltage to drive the display panel if the required power for the at least one frame of the image signal is determined to be equal to or higher than the predetermined reference power.

The display apparatus may further include a battery, and the method may further include charging the battery if the required power for the at least one frame of the image signal is determined to be less than the predetermined reference power.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiment(s) of the disclosure and together with the description serve to explain the principles of the disclosure. In the drawings.

DETAILED DESCRIPTION

Figure 1:
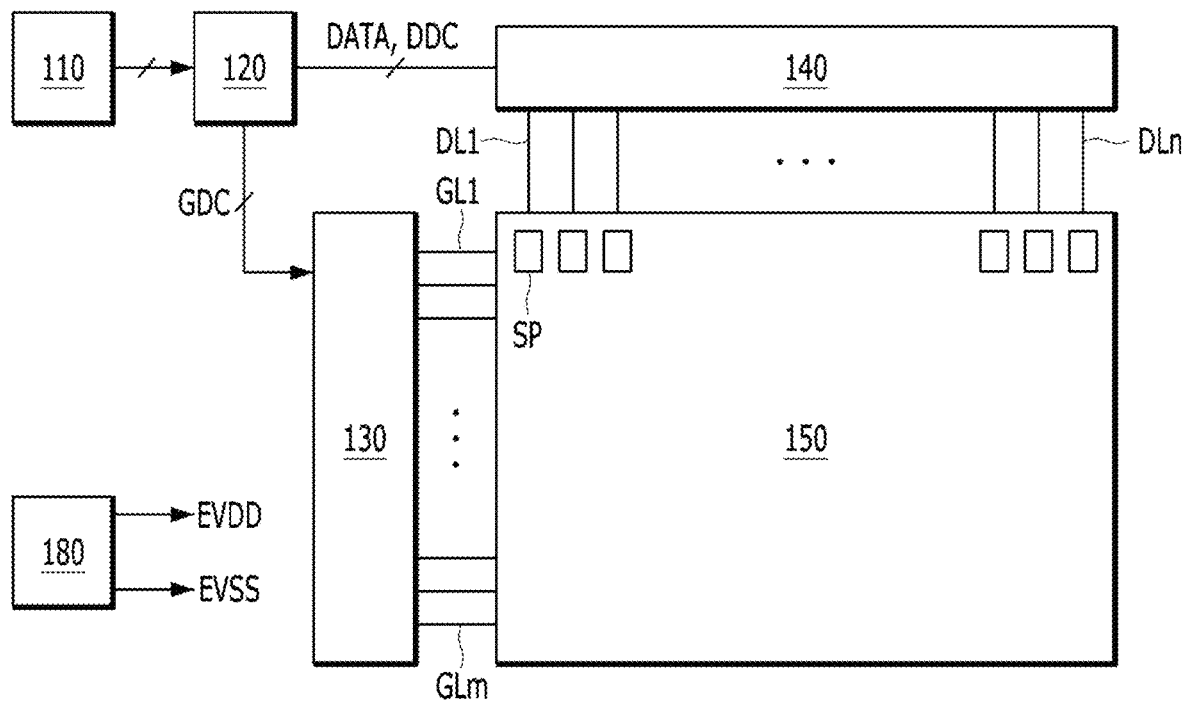
FIG. 1 is a block diagram schematically illustrating a display apparatus according to an example embodiment of the present disclosure.

Reference will now be made in detail to embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrations in the drawings. The same or similar elements are designated by the same reference numerals throughout the specification unless otherwise specified.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In construing an element, the element is construed as including an error or tolerance range even where no explicit description of such an error or tolerance range is provided.

Throughout the present specification, the same reference numerals generally designate the same or similar constituent elements unless otherwise specified.

In the following description of the present disclosure, a detailed description of known functions and configurations incorporated herein may be omitted when it may obscure the subject matter of the present disclosure.

Hereinafter, example embodiments of the present disclosure will be described in detail with reference to the attached drawings.

Figure 2:
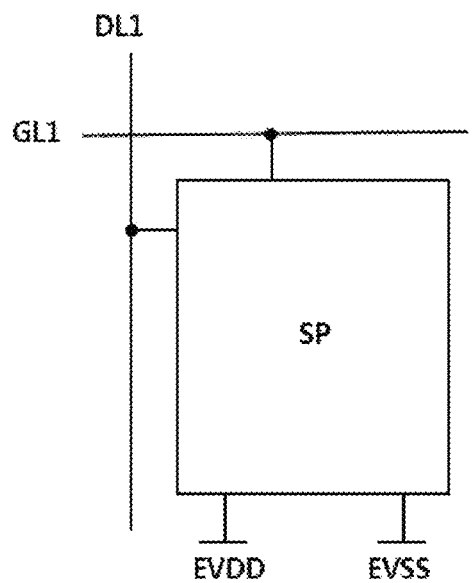
FIG. 2 is a block diagram schematically illustrating a sub-pixel included in the display apparatus of FIG. 1.

FIG. 1 is a block diagram schematically illustrating a display apparatus according to an example embodiment of the present disclosure, and FIG. 2 is a block diagram schematically illustrating a sub-pixel SP included in the example display apparatus of FIG. 1.

As illustrated in FIG. 1 and FIG. 2, a display apparatus according to an example embodiment of the present disclosure may include an image provider 110, a timing controller 120, a gate driver 130, a data driver 140, a display panel 150, and a module power supply 180.

The image provider 110 may output various driving signals along with a digital image signal supplied from the outside or a digital image signal stored in an internal memory. The image provider 110 may provide a digital image signal and various driving signals to the timing controller 120.

The timing controller 120 may output a gate timing control signal GDC for controlling operation timing of the gate driver 130, a data timing control signal DDC for controlling operation timing of the data driver 140, a vertical synchronization signal Vsync, a horizontal synchronization signal Hsync, and the like on the basis of the driving signals input from the image provider 110. The timing controller 120 may provide a digital image signal DATA supplied from the image provider 110 to the data driver 140 along with the data timing control signal DDC.

The gate driver 130 may output a gate signal in response to the gate timing control signal GDC supplied from the timing controller 120. The gate driver 130 may provide a scan signal SCAN and an emission signal EM to sub-pixels SP included in the display panel 150 through gate lines GL1 to GLm. The gate driver 130 may be configured as an integrated circuit (IC) and connected to a bonding pad of the display panel 150 through tape automated bonding (TAB) or chip on glass (COG). Alternatively, the gate driver 130 may be implemented in a gate in panel (GIP) structure and be directly formed on the display panel 150. The gate driver 130 may be integrated into the display panel 150 as necessary, but the present disclosure is not limited thereto.

The data driver 140 may convert the digital image signal DATA into an analog data voltage in response to the data timing control signal DDC supplied from the timing controller 120 and output the analog data voltage. The data driver 140 may convert the digital image signal DATA into an analog data voltage on the basis of a gamma reference voltage having a positive/negative polarity and provide the analog data voltage to the sub-pixels SP through data lines DL1 to DLn.

The data driver 140 may be configured as an IC and connected to a bonding pad of the display panel 150 through TAB or COG. Alternatively, the data driver 140 may be implemented in a GIP structure and be directly formed on the display panel 150. The data driver 140 may be integrated into the display panel 150 as necessary, but the present disclosure is not limited thereto.

The data lines DL1 to DLn and the gate lines GL1 to GLm are arranged in the display panel 150, and sub-pixels SP emitting light may be arranged at intersections of the data lines DL1 to DLn and the gate lines GL1 to GLm. A single sub-pixel SP may be connected to the first data line DL1, the first gate line GL1, a first power line EVDD and a second power line EVSS. A single sub-pixel SP may include a switching transistor, a driving transistor, a capacitor, and an organic light-emitting diode (OLED). The sub-pixel SP may include a circuit for compensating for deterioration of the light emitting OLED and for deterioration of the driving transistor that supplies a driving current to the OLED.

Sub-pixels SP may constitute a pixel unit including red, green, and blue sub-pixels or a pixel unit including red, green, blue, and white sub-pixels. Such a pixel unit may reproduce a desired color by causing at least one of the sub-pixels SP to emit light. For example, only a red sub-pixel SP may be caused to emit light with current supplied to sub-pixels of the other colors to reproduce red in the corresponding pixel unit. Further, two sub-pixels SP among red, green, and blue sub-pixels SP may be caused to emit light to reproduce a secondary color such as yellow, cyan or magenta. Such a secondary color is reproduced by a larger number of sub-pixels SP, and thus relatively high power may be necessary to reproduce the same. In addition, relatively high power may be required when an image mode is set to a more vivid mode.

The module power supply 180 may output power supplied from the outside or may convert either of a voltage or a current of the power supplied from the outside to generate voltages for driving the display apparatus. The module power supply 180 may generate and output a high-level voltage EVDD and a low-level voltage EVSS and may generate and output voltages used in operation of the gate driver 130 (e.g., a gate high voltage and a gate low voltage) or voltages used in operation of the data driver 140 (e.g., a drain voltage and a half drain voltage).

Figure 3:
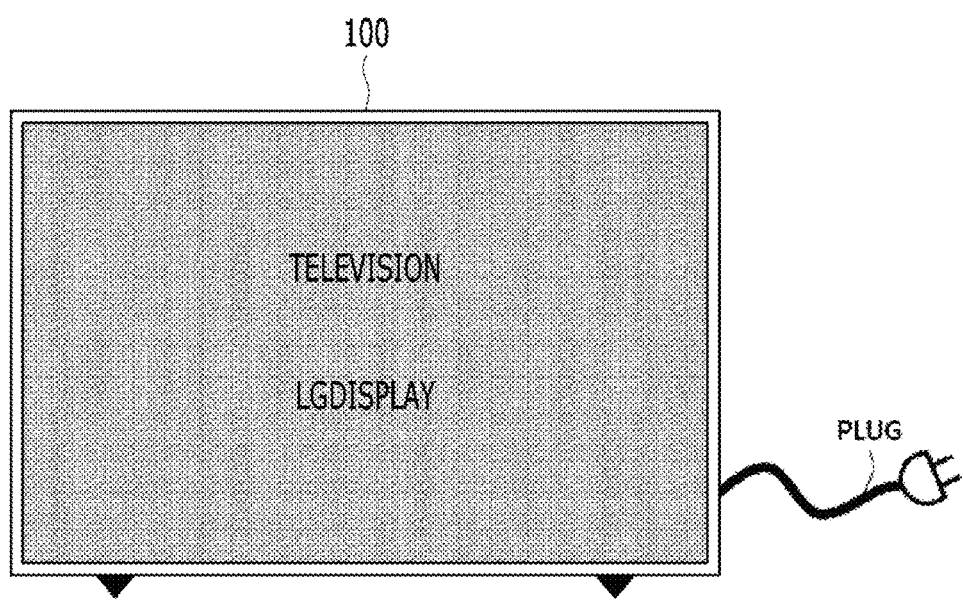
FIG. 3 is a diagram illustrating a television set implemented as the display apparatus according to an example embodiment of the present disclosure.
Figure 4:
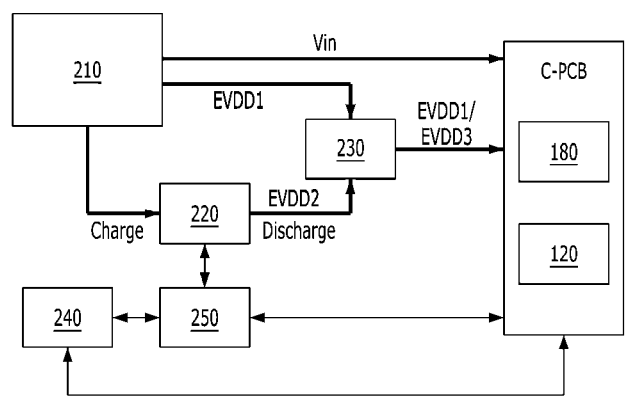
FIG. 4 is a diagram illustrating some components of the display apparatus according to an example embodiment of the present disclosure.

FIG. 3 is a diagram illustrating a television set implemented as the display apparatus according to an example embodiment of the present disclosure, and FIG. 4 is a diagram illustrating some components of the display apparatus according to an example embodiment of the present disclosure.

As illustrated in FIG. 3 and FIG. 4, the display apparatus according to an example embodiment of the present disclosure may be implemented as a television set 100. The television set 100 may receive digital image signals from a broadcasting station or a separate storage device and display images based on the digital image signals. The display apparatus implemented as the television set 100 may receive AC power through a power plug.

The display apparatus such as the television set 100 may include a control board C-PCB (Printed Circuit Board) having the timing controller 120 and the module power supply 180, a set power supply 210, a battery 220, a current sharing unit 230, a battery management unit 250, and a system on chip (SOC) 240.

The set power supply 210 may convert the AC power input through the power plug into DC power and output the DC power. The set power supply 210 may receive the AC power and generate a driving input voltage Vin, a first high-level voltage EVDD1, and a battery charging voltage. The set power supply 210 may apply the driving input voltage Vin to the control board C-PCB and apply the first high-level voltage EVDD1 to the current sharing unit 230. The set power supply 210 may apply the battery charging voltage to the battery 220.

The battery 220 may include a rechargeable battery that can be charged with the battery charging voltage supplied from the set power supply 210. The battery 220 may generate a second high-level voltage EVDD2 and output the second high-level voltage EVDD2 to the current sharing unit 230. The battery 220 may include a charging circuit for charging power, as well as a battery management system (BMS) function of detecting and managing battery information, such as measurement of a charge level, measurement of the number of charges and discharges, temperature measurement, and voltage measurement.

The battery management unit 250 may control charging/discharging functions of the battery 220 and determine a battery state (e.g., lifespan, over-voltage, low voltage, overcharge, over-discharge, overheating, short-circuit, or swelling) on the basis of battery information obtained from the battery 220. The battery management unit 250 may control the charging/discharging functions of the battery 220 according to a battery state determination result and report the battery state to the control board C-PCB and the SOC 240. The battery management unit 250 may charge the battery 220 when the second high-level voltage EVDD2 is not output from the battery 220. The battery management unit 240 may report a corresponding state when predetermined conditions are satisfied, such as when the charge level of the battery is determined to be at or below a reference level, when a remaining lifespan of the battery is determined to be at or below a reference value, when the battery is determined to be failing, and the like.

The current sharing unit 230 may be controlled according to a switch signal SW to output the first high-level voltage EVDD1 or a third high-level voltage EVDD3 higher than the first high-level voltage EVDD1. For example, when the switching signal SW at an off level is input, the current sharing unit 230 may supply the first high-level voltage EVDD1 output from the set power supply 210 to the control board C-PCB and block the second high-level voltage EVDD2 output from the battery 220. When the switch signal SW at an on level is input, the current sharing unit 230 may integrate the first high-level voltage EVDD1 output from the set power supply 210 and the second high-level voltage EVDD2 output from the battery 220 and supply the third high-level voltage EVDD3 to the control board C-PCB. The third high-level voltage EVDD3 may have the same level as the first high-level voltage EVDD1 but have a current amount increased by the second high-level voltage EVDD2 from the battery 220. Thus, the third high-level voltage EVDD3 may have a higher power than the first high-level voltage EVDD1. Accordingly, when a power higher than the first high-level voltage EVDD1 output from the set power supply 210 is required in order to display an image on the display panel 150, the switch signal SW at the on level may be applied to the current charging unit 230. The switch signal SW may be output from a processor capable of determining a required high-level voltage EVDD, such as the timing controller 120 of the control board C-PCB.

The SOC 240 may include a graphics processing circuit, such as a scaler, may convert a digital image signal input from a broadcast receiving circuit or an external video source into a signal with a resolution suitable to be displayed on the display panel 150, and may output the converted signal. The SOC 240 may supply a digital image signal and driving signals, such as the vertical synchronization signal Vsync, the horizontal synchronization signal Hsync, and a clock signal CLK, to the control board C-PCB. Here, if the SOC 240 applies the switch signal SW to the current sharing unit 230, the SOC 240 may check for a power required for each frame of the digital image signal. The SOC 240 may compare the power required for each frame with a reference power and apply the switch signal SW at the on level to the current sharing unit 230 upon determining that the required power is higher than or equal to the reference power.

The control board C-PCB may include the timing controller 120 and the module power supply 180. The control board C-PCB may receive a digital image signal and the driving input voltage Vin. In addition, the control board C-PCB may receive the first high-level voltage EVDD1 or the third high-level voltage EVDD3.

The module power supply 180 may generate a logic power supply voltage VDD using the driving input voltage Vin and supply the logic power supply voltage VDD to the timing controller 120. In addition, the module power supply 180 may supply the high-level voltage EVDD1 or EVDD3 to sub-pixels SP or display elements of the display panel 150 and to the timing controller 120. The logic power supply voltage VDD may be applied to such circuits as the timing controller 120, the gate driver 130, and the data driver 140 to drive the circuits. The high-level voltage EVDD1 or EVDD3 may be supplied to the timing controller 120 and the sub-pixels SP of the display panel 150 to drive the sub-pixels SP. The logic power supply voltage VDD may be set to about 12 V and the third high-level voltage EVDD3 applied to drive the sub-pixels SP may be set to about 24 V, but the present disclosure is not limited thereto.

The timing controller 120 may start to operate upon reception of the logic power supply voltage VDD from the module power supply 180. The high-level voltage EVDD1 or EVDD3 may be supplied to the sub-pixels SP of the display panel 150 according to the timing controller 120 upon start of the operation of the timing controller 120. The timing controller 120 may receive a digital image signal and driving signals, such as the vertical synchronization signal Vsync, the horizontal synchronization signal Hsync, and the clock signal CLK, from the SOC 240. The timing controller 120 may control operation timings of the data driver 140 and the gate driver 130 based on the driving signals and provide the digital image signal to the data driver 150. Here, the timing controller may check for the power required for each frame of the digital image signal by applying the switch signal SW to the current sharing unit 230. The timing controller 120 may compare the power required for each frame with the reference power and apply the switch signal SW at the on level to the current sharing unit 230 upon determining that the required power is higher than or equal to the reference power.

In addition, the timing controller 120 may cause battery state information received from the battery management unit 250 to be displayed on the display panel 150. For example, the timing controller 120 may cause a message representing the remaining lifespan of the battery, battery failure, or the like to be displayed on the display panel 150. Such a battery state information display function may be implemented by the SOC 240. The SOC 240 may generate a message image representing the remaining lifespan of the battery, battery failure, or the like depending on battery state information received from the battery management unit 250 and transmit the message image to the timing controller 120.

The timing controller 120 may control the luminance of each frame displayed on the display panel 150 to be maintained at a reference luminance or less in order to reduce the required power upon determining that a charge level of the battery, received from the battery management unit 250, is at a predetermined value or less. When the luminance of each frame is maintained at the reference luminance or less, the switch signal SW at the off level may be input to the current sharing unit 230 so that the first high-level voltage EVDD1 output from the set power supply 210 may be applied to the control board C-PCB. Accordingly, the second high-level voltage EVDD2 output from the battery 220 may be blocked, and the charging voltage output from the set power supply 210 may be charged in the battery 220. Such a luminance limitation function may be implemented by the SOC 240. The SOC 240 may control the luminance of each frame of the digital image signal supplied to the timing controller 120 to be maintained at the reference luminance or less upon determining that the charge level of the battery, received from the battery management unit 250, is at or below the reference level.

Figure 5:
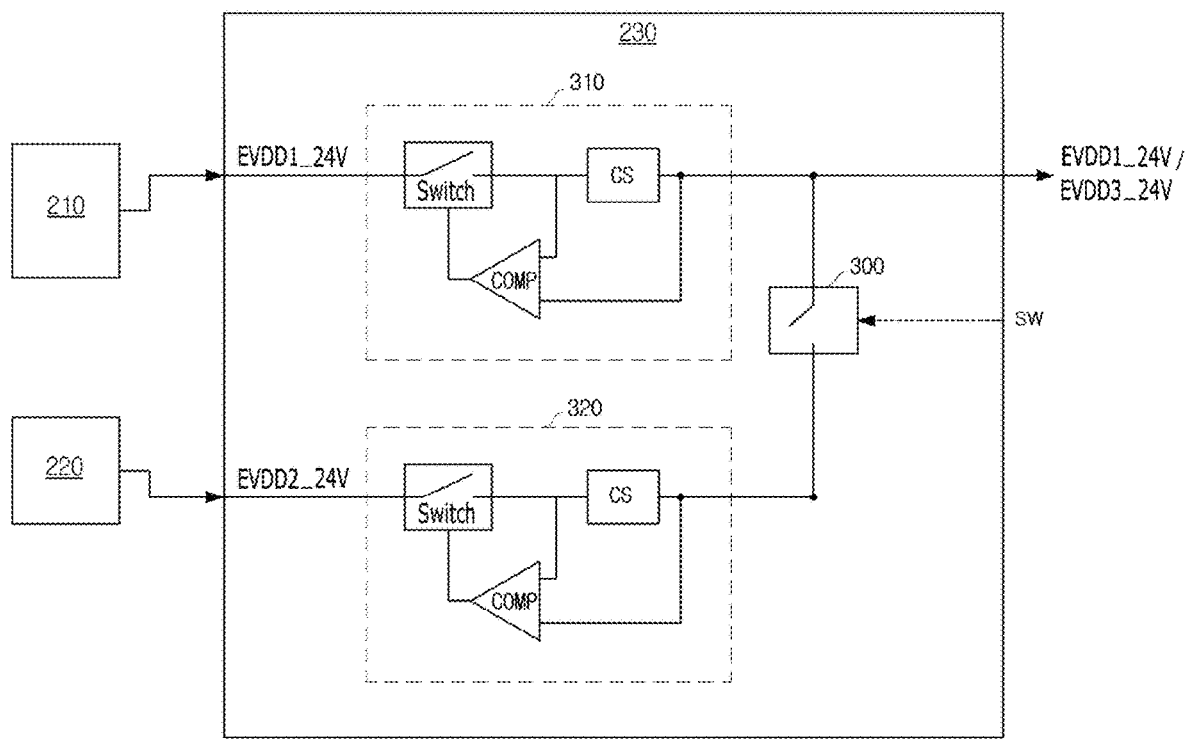
FIG. 5 is a diagram illustrating a configuration of a current sharing unit of FIG. 4.

FIG. 5 is a diagram illustrating a configuration of the current sharing unit 230.

As shown in FIG. 5, the current sharing unit 230 may include a first current limit circuit 310 for limiting the current of the first high-level voltage EVDD1 output from the set power supply 210, a second current limit circuit 320 for limiting the current of the second high-level voltage EVDD2 output from the battery 220, and a switch 300 that turns on/off according to the switch signal SW to determine whether to connect an output line for the first high-level voltage EVDD1 to an output line for the second high-level voltage EVDD2.

The first current limit circuit 310 may detect the current of the first high-level voltage EVDD1 output from the set power supply 210 and block the output line for the first high-level voltage EVDD1 if the current increases. The first current limit circuit 310 may include a switch Switch connected to a power line through which the first high-level voltage EVDD1 is supplied, a current sensor CS for sensing a current, and a comparator Comp that compares a current at the input terminal of the current sensor CS with a current at the output terminal of the current sensor CS and outputs a control signal to the switch Switch according to a comparison result. The comparator Comp may output a control signal for controlling the switch Switch to turn off when the current of the first high-level voltage EVDD1 output through the power line increases.

The second current limit circuit 320 may detect the current of the second high-level voltage EVDD2 output from the battery 220 and block the output line for the second high-level voltage EVDD2 if the current increases. The second current limit circuit 320 has the same configuration as the first current limit circuit 310, and thus detailed description thereof is omitted. The second current limit circuit 320 may be connected to a power line through which the second high-level voltage EVDD2 is supplied and may output a control signal for controlling the switch Switch to be turned off when the current of the second high-level voltage EVDD2 increases.

The first high-level voltage EVDD1 output from the set power supply 210 and the second high-level voltage EVDD2 output from the battery 220 can be stably applied, respectively, according to the first current limit circuit 310 and the second current limit circuit 320 having the aforementioned configuration.

The switch 300 may turn on/off according to the switch signal SW supplied from the SOC 240 or the timing controller 120 to connect the output line for the first high-level voltage EVDD1 to the output line for the second high-level voltage EVDD2 or disconnect the output lines from each other.

When the switch 300 is turned off, the output line for the first high-level voltage EVDD1 is disconnected from the output line for the second high-level voltage EVDD2. Accordingly, the current sharing unit 230 can output the first high-level voltage EVDD1 output from the set power supply 210.

When the switch 300 is turned on, the output line for the first high-level voltage EVDD1 is connected to the output line for the second high-level voltage EVDD2 and thus the set power supply 210 is connected in parallel to the battery 220. Accordingly, the first high-level voltage EVDD1 output from the set power supply 210 and the second high-level voltage EVDD2 output from the battery 220 can be combined in parallel and be output as the third high-level voltage EVDD3 by the current sharing unit 230. Since the set power supply 210 is connected in parallel to the battery 220, the current of the finally output third high-level voltage EVDD3 equals the sum of the current of the first high-level voltage EVDD1 and the current of the second high-level voltage EVDD2. Here, both the first high-level voltage EVDD1 and the second high-level voltage EVDD2 may be the same voltage, for example, 24 V. Accordingly, the third high-level voltage EVDD3 may be 24 V, and the current thereof may equal the sum of the current of the first high-level voltage EVDD1 and the current of the second high-level voltage EVDD2. Thus, thus the third high-level voltage EVDD3 can be output as a high power.

According to this configuration, the current sharing unit 230 may output the first high-level voltage EVDD1 output from the set power supply 210 or the third high-level voltage EVDD3 corresponding to the combination of the voltages EVDD1 and EVDD2 output respectively from the set power supply 210 and the battery 220 according to the switch signal SW supplied from the SOC 240 or the timing controller 120. When required power is higher than or equal to a reference level, that is, when power equal to or higher than the first high-level voltage EVDD1 output from the set power supply 210 is required, the current sharing unit 230 may add the power from the battery 220 to the high-level voltage EVDD1 to output the third high-level voltage EVDD3. Accordingly, the rated power required to be provided by the set power supply 210 can be reduced and thus the size of the set power supply 210 can be decreased.

In the circuit configuration for accomplishing the current sharing unit 230, the switch types and connection method may be modified in various manners and applied to obtain further improved effects. Thus, the circuit configuration is not limited to the above-described example embodiment.

Figure 6:
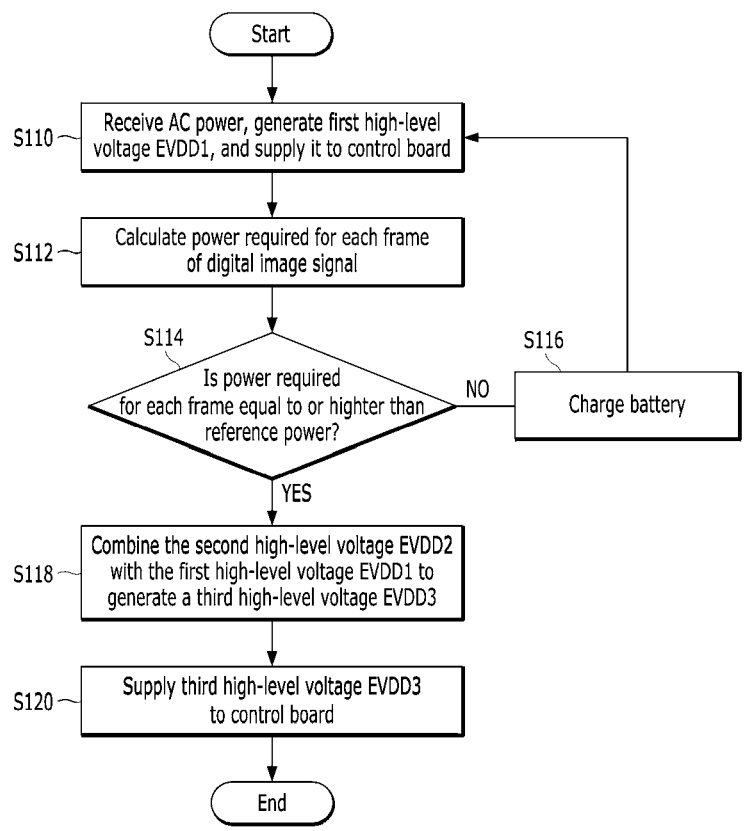
FIG. 6 is a flowchart of a method for controlling the display apparatus according to an example embodiment of the present disclosure.

FIG. 6 is a flowchart of a method for controlling the display apparatus according to an example embodiment of the present disclosure.

The display apparatus implemented as the television set 100 may receive AC power through the plug PLUG. Then, the display apparatus may generate the first high-level voltage EVDD1 and supply the first high-level voltage EVDD1 to the control board C-PCB including the timing controller 120 and the module power supply 180 (S110).

The display apparatus may calculate power required for each frame of a digital image signal (S112) and determine whether the required power is equal to or higher than a reference power (S114). The power required for each frame may increase for various reasons, for example, when the corresponding frame includes multiple secondary colors, such as cyan and magenta, when an image mode is set to a vivid mode, and the like. The timing controller 120, the SOC 240, or an additional image processor may check the power required for each frame of the digital image signal and determine whether the required power is equal to or higher than the reference power. Here, the reference power may be a power that can be supplied using the first high-level voltage EVDD1.

If the required power is less than the reference power, the state in which the first high-level voltage EVDD1 is supplied is maintained. When the battery is not used in this manner, the battery can be charged at any time (S116).

If the required power is determined to be equal to or higher than the reference power, the first high-level voltage EVDD1 and the second high-level voltage EVDD2 from the battery 220 may be combined to generate the third high-level voltage EVDD3 (S118).

The generated third high-level voltage EVDD3 may be supplied to the control board C-PCB to cause an image of the corresponding frame to be displayed (S120).

As described above, the display apparatus according to an example embodiment of the present disclosure may supply the first high-level voltage EVDD1 for displaying an image. Also, when it receives an image input data to display a frame that requires power higher than the first high-level voltage EVDD1, the example display apparatus may combine the second high-level voltage EVDD2 of the battery 220 with the first high-level voltage EVDD1 to generate the third high-level voltage EVDD3 and supply the third high-level voltage EVDD3 to display the image.

As described above, the display apparatus according to an example embodiment of the present disclosure may include both (1) the power supply that receives AC power from a power plug and outputs the first high-level voltage EVDD1 and (2) the rechargeable battery to add the power from the battery to the first high-level voltage EVDD1 to output the third high-level voltage EVDD3 when power equal to or higher than the first high-level voltage EVDD1 is required. Accordingly, the rated power to be provided by the power supply 210 included in the display apparatus may be reduced and thus the size of the set power supply 210 can be decreased. Consequently, the thickness and the volume of the display apparatus can be reduced.

The power supply device and the display apparatus including the same according to the present disclosure may include a rechargeable battery for supplying a high-power voltage and thus can decrease the rated power to be provided by the power supply included in the display apparatus to reduce the manufacturing cost and the size of the power supply. Consequently, a compact display apparatus can be achieved.

Furthermore, it is possible to reduce the manufacturing cost of the display apparatus by decreasing the thickness and the volume of the display apparatus by applying the power supply device of the present disclosure.

Effects which may be obtained by the present disclosure are not limited to the above-described effects, and various other effects may be evidently understood by those skilled in the art to which the present disclosure pertains.

It will be apparent to those skilled in the art that various modifications and variations can be made in the power supply device and the display apparatus including the same according the present disclosure without departing from the spirit or scope of the disclosure. Thus, it is intended that the present disclosure cover the modifications and variations of this disclosure provided they come within the scope of the appended claims and their equivalents.

What is claimed is:

1. A display apparatus, comprising:
   a display panel having a plurality of sub-pixels and configured to display an image based on an image signal provided to the display panel;
   a controller configured to determine a required power for at least one frame of the image signal and to output a switch signal based on determining if the required power is equal to or higher than a predetermined reference power; and
   a power supply device configured to receive an external AC power and to generate a first high-level voltage and a second high-level voltage, the power supply device being further configured, based on the switch signal:
   to output the first high-level voltage to drive the display panel, or
   to combine the second high-level voltage with the first high-level voltage to generate a third high-level voltage and to output the third high-level voltage to drive the display panel.

2. The display apparatus of claim 1, wherein the controller includes at least one of:
   a timing controller configured to supply the image signal to the display panel and to control operation timing of the display panel; and
   a system on chip (SOC) configured to drive the display panel.

3. The display apparatus of claim 1, wherein the power supply device is configured:
   to output the first high-level voltage to drive the display panel if the required power for the at least one frame of the image signal is determined to be lower than the predetermined reference power; and
   to combine the second high-level voltage with the first high-level voltage to generate a third high-level voltage and to output the third high-level voltage to drive the display panel if the required power for the at least one frame of the image signal is determined to be equal to or higher than the predetermined reference power.

4. The display apparatus of claim 1, wherein the power supply device comprises:
   a first power supply configured to receive the AC power and to generate the first high-level voltage;
   a battery configured to generate the second high-level voltage; and
   a current sharing circuit configured to output the first high-level voltage or the third high-level voltage to drive the display panel based on the switch signal.

5. The display apparatus of claim 4, wherein the controller is configured to output a turn-on switch signal as the switch signal to the current sharing circuit such that the third high-level voltage is output if the required power for the at least one frame of the image signal is equal to or higher than the predetermined reference power.

6. The display apparatus of claim 4, wherein the controller is configured to limit a luminance of the image signal displayed on the display panel if a charge level of the battery is at or below a reference level.

7. The display apparatus of claim 4, further comprising a battery management circuit configured to control the AC power to be charged in the battery and to detect a state of the battery, including at least one of a lifespan of the battery, a voltage level of the battery, a charge level of the battery, a temperature of the battery, and a battery failure state.

8. The display apparatus of claim 7, wherein the controller is configured to receive the state of the battery from the battery management circuit and to provide information on the state of the battery to the display panel to be displayed on the display panel.

9. The display apparatus of claim 4, wherein the current sharing circuit includes at least one of:
   a first current limit circuit connected to an output line of the first power supply and configured to limit a current value of the first high-level voltage to a first predetermined value or less; and
   a second current limit circuit connected to an output line of the battery and configured to limit a current value of the second high-level voltage to a second predetermined value or less.

10. The display apparatus of claim 4, wherein the current sharing circuit is configured to connect an output line of the first power supply and an output line of the battery in parallel to output the third high-level voltage based on the switch signal.

11. The display apparatus of claim 10, wherein the current sharing circuit includes a switch configured:
   to connect the output line of the first power supply for the first high-level voltage with the output line of the battery for the second high-level voltage if the switch signal is a turn-on switch signal; and
   to disconnect the output line of the first power supply for the first high-level voltage from the output line of the battery for the second high-level voltage if the switch signal is a turn-off switch signal.

12. The display apparatus of claim 4, wherein the battery is configured to be charged if the required power for the at least one frame of the image signal is determined to be less than the predetermined reference power.

13. A power supply device for use in a display apparatus comprising a display panel and a controller, the power supply device comprising:
   a first power supply configured to receive an AC power and to generate a first high-level voltage;
   a battery configured to generate a second high-level voltage; and
   a current sharing circuit configured, based on a switch signal from the controller:
      to output the first high-level voltage to drive the display panel, or
      to combine the first high-level voltage with the second high-level voltage to generate a third high-level voltage and to output the third high-level voltage to drive the display panel.

14. The power supply device of claim 13, further comprising a battery management circuit configured to control the AC power to be charged in the battery and to detect a state of the battery, including at least one of a lifespan of the battery, a voltage level of the battery, a charge level of the battery, a temperature of the battery, and a battery failure state.

15. The power supply device of claim 13, wherein the current sharing circuit includes at least one of:
   a first current limit circuit connected to an output line of the first power supply and configured to limit a current value of the first high-level voltage to a first predetermined value or less; and
   a second current limit circuit connected to an output line of the battery and configured to limit a current value of the second high-level voltage to a second predetermined value or less.

16. The power supply device of claim 13, wherein the current sharing circuit is configured to connect an output line of the first power supply and an output line of the battery in parallel to output the third high-level voltage based on the switch signal.

17. The power supply device of claim 16, wherein the current sharing circuit includes a switch configured:
   to connect the output line of the first power supply for the first high-level voltage with the output line of the battery for the second high-level voltage if the switch signal is a turn-on switch signal; and
   to disconnect the output line of the first power supply for the first high-level voltage from the output line of the battery for the second high-level voltage if the switch signal is a turn-off switch signal.

18. A method of supplying power in a display apparatus comprising a display panel having a plurality of sub-pixels and configured to display an image based on an image signal, the method comprising:
   receiving an AC power and generating a first high-level voltage;
   generating a second high-level voltage;
   determining a required power for at least one frame of the image signal;
   outputting a switch signal based on determining if the required power is equal to or higher than a predetermined reference power; and
   based on the switch signal:
      outputting the first high-level voltage to drive the display panel, or
      combining the second high-level voltage with the first high-level voltage to generate a third high-level voltage and outputting the third high-level voltage to drive the display panel.

19. The method of claim 18, wherein the outputting of the first high-level voltage or the third high-level voltage based on the switch signal includes:
   outputting the first high-level voltage to drive the display panel if the required power for the at least one frame of the image signal is determined to be lower than the predetermined reference power, or
   combining the second high-level voltage with the first high-level voltage to generate a third high-level voltage and outputting the third high-level voltage to drive the display panel if the required power for the at least one frame of the image signal is determined to be equal to or higher than the predetermined reference power.

20. The method of claim 18, wherein the display apparatus further comprises a battery, the method further comprising:
   charging the battery if the required power for the at least one frame of the image signal is determined to be less than the predetermined reference power.

* * * * *